(12) United States Patent
Schmitt et al.

(10) Patent No.: US 10,058,013 B2
(45) Date of Patent: *Aug. 21, 2018

(54) ENVIRONMENT-CONTROLLED COOLING MODE SELECTION FOR A MODULAR DATA CENTER BASED ON DETECTION OF CONTAMINANTS AND PARTICULATES IN OUTSIDE AIR

(71) Applicant: DELL PRODUCTS, L.P., Round Rock, TX (US)

(72) Inventors: Ty Schmitt, Round Rock, TX (US); Mark Bailey, Round Rock, TX (US); Trey Wiederhold, Cedar Park, TX (US); Tyler Duncan, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 382 days.

This patent is subject to a terminal disclaimer.

(21) Appl. No.: 14/590,790

(22) Filed: Jan. 6, 2015

(65) Prior Publication Data
US 2016/0195293 A1 Jul. 7, 2016

(51) Int. Cl.
*F24F 11/00* (2018.01)
*H05K 7/20* (2006.01)
*F24F 110/52* (2018.01)

(52) U.S. Cl.
CPC ..... *H05K 7/20836* (2013.01); *H05K 7/20745* (2013.01); *F24F 2011/0002* (2013.01); *F24F 2110/52* (2018.01); *Y02B 30/78* (2013.01)

(58) Field of Classification Search
CPC .............. H05K 7/20745; H05K 7/20836
See application file for complete search history.

(56) References Cited

U.S. PATENT DOCUMENTS 6,790,136 B2 * 9/2004 Sharp ................... F24F 11/0001
454/229
6,800,022 B2 10/2004 Urbank et al.
(Continued)

OTHER PUBLICATIONS

BusinessDictionary.com. Article. [online]. 2008 [retrieved on Jul. 22, 2017]. Retrieved from internet: <URL: https://web.archive.org/web/20080128184902/http://www.businessdictionary.com/definition/air-pollution.html>.*

(Continued)

*Primary Examiner* — Robert E Fennema
*Assistant Examiner* — Marzia T Monty
(74) *Attorney, Agent, or Firm* — Isidore PLLC

(57) ABSTRACT

A cooling system circulates cooling air through information technology (IT) modules within a large scale information handling system (IHS). An air handling unit (AHU) directs cooling air through an IT module. The AHU is in communication with a controller. The controller is also in communication with an ambient condition interface to determine a level of a contaminant in outside air. The controller further: determines whether the level of the contaminant exceeds a threshold; and in response to determining that the level of the contaminant exceeds the threshold, configures the AHU to perform a mechanical cooling mode that excludes the outside air by recirculating air within an IT module via the AHU. In response to the level of contaminants not exceeding the threshold and other detected ambient conditions are favorable to using outside air to cool the IHS, the controller configures the AHU to use outside air.

20 Claims, 10 Drawing Sheets

(56) References Cited

U.S. PATENT DOCUMENTS

| | | | |
|---|---|---|---|
| 7,734,858 B2 | 6/2010 | Loffink et al. | |
| 8,151,011 B2 | 4/2012 | Chiasson et al. | |
| 8,151,578 B1* | 4/2012 | Morales | F24F 3/0442 |
| | | | 62/259.2 |
| 8,452,489 B2 | 5/2013 | Marra | |
| 8,694,693 B2 | 4/2014 | Lambert et al. | |
| 9,313,929 B1* | 4/2016 | Malone | H05K 7/20836 |
| 2007/0082601 A1 | 4/2007 | Desrochers et al. | |
| 2010/0154448 A1* | 6/2010 | Hay | G06F 1/20 |
| | | | 62/175 |
| 2013/0137357 A1 | 5/2013 | Chang et al. | |
| 2013/0176675 A1* | 7/2013 | Hundertmark | F24F 12/006 |
| | | | 361/679.31 |
| 2014/0038510 A1 | 2/2014 | Bailey et al. | |
| 2014/0069127 A1 | 3/2014 | Bailey et al. | |
| 2015/0007595 A1* | 1/2015 | Karkhanis | F25B 49/022 |
| | | | 62/115 |

OTHER PUBLICATIONS

Patent Cooperation Treaty (PCT) International Search Report and Written Opinion, International Application No. PCT/US15/33228, dated Sep. 2, 2015.

International Search Report and Written Opinion, International Application No. PCT/US15/33228, dated Jul. 11, 2017.

\* cited by examiner

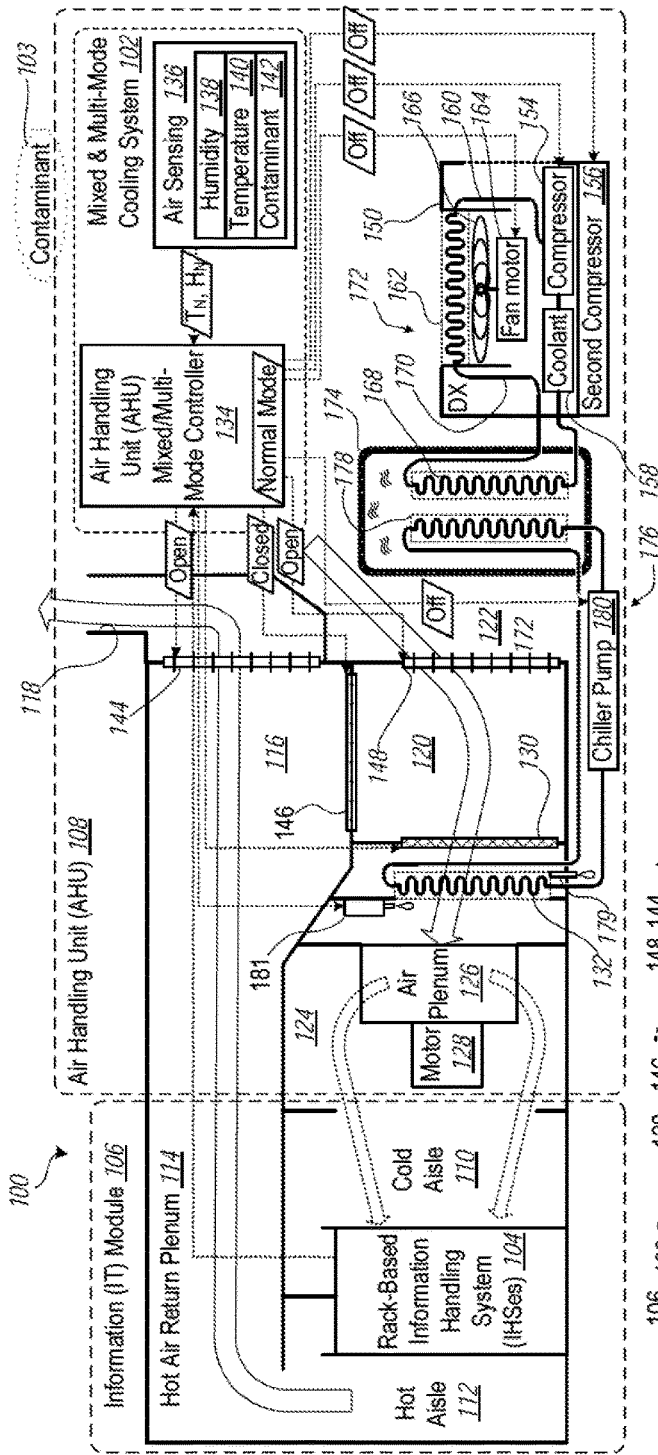
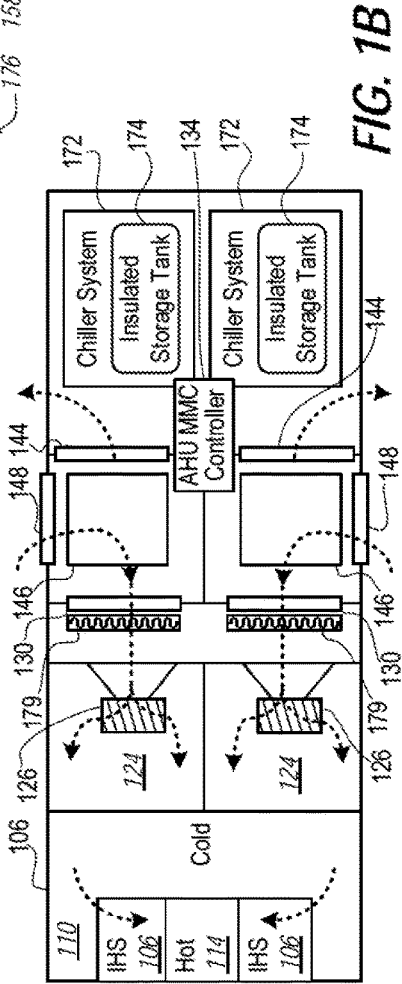
FIG. 1A
FIG. 1B

ENVIRONMENT-CONTROLLED COOLING MODE SELECTION FOR A MODULAR DATA CENTER BASED ON DETECTION OF CONTAMINANTS AND PARTICULATES IN OUTSIDE AIR

BACKGROUND

1. Technical Field

The present disclosure relates in general to cooling information handling resources of a modular data center, and more particularly to using air handling units (AHUs) to selectively using uncontaminated outside air to provide directed and controlled cooling to a large scale information handling system (IHS).

2. Description of the Related Art

As the value and use of information continue to increase, individuals and businesses seek additional ways to process and store information. One option available to users is information handling systems (IHSes). An IHS generally processes, compiles, stores, and/or communicates information or data for business, personal, or other purposes, thereby allowing users to take advantage of the value of the information. Because technology and information handling needs and requirements vary between different users or applications, IHSes may also vary regarding what information is handled, how the information is handled, how much information is processed, stored, or communicated, and how quickly and efficiently the information may be processed, stored, or communicated. The variations in IHSes allow for IHSes to be general or configured for a specific user or specific use such as financial transaction processing, airline reservations, enterprise data storage, or global communications. In addition, IHSes may include a variety of hardware and software components that may be configured to process, store, and communicate information and may include one or more computer systems, data storage systems, and networking systems.

As the capabilities of information handling systems have improved, the power requirements of IHSes and their component information handling resources have increased. Accordingly, the amount of heat produced by such information handling resources has increased. Because the electrical properties of information handling resources may be adversely affected by the presence of heat (e.g., heat may damage sensitive information handling resources and/or some information handling resources may not operate correctly outside of a particular range of temperatures), information handling systems often include cooling systems configured to cool such information handling resources.

The construction and configuration of cooling systems may be of particular difficulty in data centers. A data center will typically include multiple IHSes (e.g., servers), which may be arranged in racks. Modular data centers further arrange these racks in modular building blocks. Each IHS and its component information handling resources may generate heat, which can adversely affect the various IHSes and their component information handling resources if the generated heat is not efficiently removed or reduced. To cool information handling systems in data centers, information handling systems are often cooled via the impingement of air driven by one or more air movers. To effectively control the temperature of information handling resources, especially in installations in which a modular data center is outdoor-exposed (e.g., those placed on building roofs or elsewhere), the modular data center must provide support for extreme temperatures, weather, and airflow ranges. However, relying solely upon mechanical cooling can be costly and lead to other secondary problems with air quality and others that can negatively affect the IHSes.

Increasing use of outside air for economical cooling can subject the IHS to damage from contaminants. Gaseous, liquid and solid particulate types of contaminants can be present in outside air. One example of contaminants are corrosive substances such as chlorine. The levels of contaminants can vary based upon weather conditions and varying human activity.

BRIEF SUMMARY

In accordance with the teachings of the present disclosure, the amount of resources necessary for cooling a data center comprising information handling systems has been substantially reduced by utilization of outside air cooling when a level of contaminants in the outside air are acceptable. The amount of damage to information technology (IT) components caused by the presence of contaminants in outside air is substantially reduced and/or eliminated via implementation of controlled intake of outside air, based on detected contaminant levels and filtering capabilities of the cooling system. Filtering of contaminants is also provided to enable an expanded use of outside air. With the information handling system being exposed to only low levels of contaminates in the cooling air, the cooling of a data center can be optimized to utilize outside air, based upon other ambient conditions such as temperature and humidity.

In accordance with embodiments of the present disclosure, a cooling system is provided to circulate cooling air through IT modules within a large scale information handling system (IHS). In one embodiment, the cooling system includes an air handling unit (AHU) to direct cooling air through one or more IT modules. The cooling system includes an ambient condition interface in communication with an outside contaminant sensor to determine a level of outside contaminants. The cooling system includes a controller in communication with the ambient condition interface and the AHU. The controller performs operations that enable the cooling system to: (i) determine a level of one or more contaminants in the outside air; (ii) determine whether the level of the contaminant(s) exceeds a threshold; and (iii) in response to determining that the level of the contaminant (s) exceeds the threshold, configure the AHU to perform cooling via a mechanical cooling mode that reduces the use of outside air by recirculating air within an IT module via the AHU. Outside air cooling is automatically enabled once the contaminant level does not exceed the threshold and other ambient conditions are favorable to use of outside air to cool the IHS.

According to illustrative embodiments of the present disclosure, a method is provided for circulating cooling air through IT modules within a large scale IHS having an AHU. In one embodiment, the method includes determining a level of a contaminant in outside air. The method includes determining whether the level of the contaminant exceeds a threshold. The method further includes, in response to determining that the level of the contaminant exceeds the threshold, configuring the AHU to perform cooling using a mechanical cooling mode in which the AHU substantially reduces or halts the intake of outside air and performs cooling of the IT module utilizing recirculation of air within the IT module. The method also includes automatically configuring the AHU to perform cooling using the outside air when the contaminant level does not exceed the threshold and other ambient conditions are favorable to using outside air to cool the IHS.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 1A illustrates a diagrammatic side view of a mixed and multi-mode cooling system that configures an air handling unit (AHU) to cool an information technology (IT) module of a data center via standard mode cooling, according to one or more embodiments;

FIG. 1B illustrates a diagrammatic top view of the mixed and multi-mode cooling system of FIG. 1A that configures an AHU to cool an IT module of a data center via standard mode cooling, according to one or more embodiments;

DETAILED DESCRIPTION

Figure 2A:
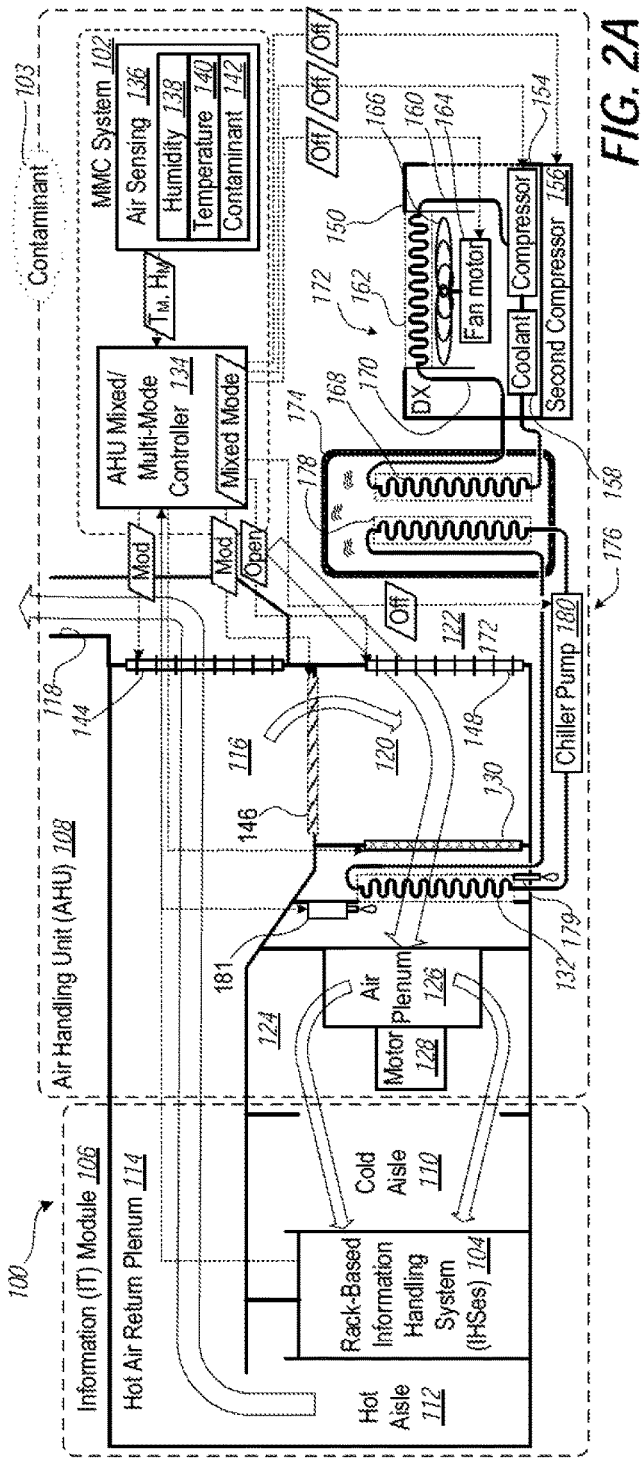
FIG. 2A illustrates a diagrammatic side view of the mixed and multi-mode cooling system of FIG. 1A that configures the AHU to cool the IT module of the data center via mixed mode cooling, according to one or more embodiments.

The present disclosure provides a cooling system that includes an air handling unit (AHU) that circulates cooling air through an information technology (IT) module containing rack-based information handling systems in a closed mode whenever a level of contaminant in outside air exceeds a threshold. The AHU utilizes a normal mode cooling, which includes use of the outside air and limited or no recirculation of air within the data center, when outside temperature and/or humidity are within an acceptable range and the level of contaminant in the outside air does not exceed the threshold. When the level of contaminant is below the threshold, the cooling modes implemented by the cooling system can be based on one or more detected conditions in and around the data center, with a default mode including the use of outside air.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIGS. 1A-1B illustrate a block diagram representation of an example data center 100 having a mixed and multi-mode cooling (MMC) system 102 that operates to prevent damage to the IT gear inside the data center due to a high level (above respective preset thresholds) of one or more contaminant(s) 103 in the outside air. When permissible, based on the presence of only a low level of contaminant 103, the MMC system 102 can reduce energy costs by expanding use of outside air for cooling within a hybrid mode operation. Hybrid mode cooling can include the mixed mode that refers to using recirculated air to warm outside air that is otherwise too cold or too humid. The hybrid mode cooling can also include multi-mode cooling, which involves performing mechanical cooling while using outside cooling air, referred to herein as mechanical trimming. The expanded use of outside air includes partial use of outside air even when the outside temperature and the outside humidity are not within an acceptable range for information handling systems (IHSes) 104 within an information technology (IT) module 106 of the data center 100. In one embodiment, the MMC system 102 directly controls an air handling unit (AHU) 108 that provides cooling to at least one IT module within modular data center 100. In at least one embodiment, the data center is and/or is configured as an expandable modular Information Technology (IT) Building Infrastructure (EMITBI). Further, because of the relatively large scale of data center and the use of modular building blocks that house the IT gear within the data center, the combination of IT modules that are cooled by the AHUs is collectively referred to herein as modularly-constructed, large-scale information handling system (LIHS) or simply an IHS. Within the general context of IHSes, an information handling system (IHS) 104 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components or the IHS may include one or more storage devices, one or more communications ports for communicating with external devices as well as various input and output (I/O) devices, such as a keyboard, a mouse, and a video display. The IHS may also include one or more buses operable to transmit communication between the various hardware components. It is appreciated that the IHS described within the present disclosure is a LIHS, with servers acting as the individual processing units.

Data center 100 of FIG. 1A (with top view of some components also illustrated by FIG. 1B) includes an IT module 106 having a row of rack-mounted IHSes 104 that separate a cold aisle 110 from a hot aisle 112, which is in fluid communication with a hot air return plenum 114. The AHU 108 includes a return chamber 116 that is in fluid communication with the hot air return plenum 114. The AHU 108 includes an exhaust portal, such as, but not limited to, an exhaust chimney 118, which is in fluid communication with the return chamber 116. The AHU 108 includes an intake chamber 120 that is fluid communication with the return chamber 116 and an outside environment 122. In one embodiment, the exhaust chimney 118 mitigates warmed air from being drawn into the intake chamber 120. However, an exhaust portal can a flush mounted, relying on spacing to prevent inadvertent recirculation. It is appreciated that the outside environment encompasses some or all of the exterior of the AHU and data center, and the specific location illustrated within the figure only references one location adjacent/relative to the intake chamber for simplicity in describing the intake process of external air. The AHU 108 includes an air mover to move air through the IT module 106. Specifically, The AHU 108 includes an outlet chamber 124 that is uniform pressurized by an air plenum blower 126 driven by a motor 128. The air plenum blower 126 pulls air in axially and sprays it our radially within an enclosed space to pressurize evenly. The air plenum blower 126 draws air from the intake chamber 120 through a contaminant filter 130 and a chiller coil 132. The pressurized air in the outlet chamber 124 exits the AHU 108 and enters the cold aisle 110 of the IT module 106.

Performance of the contaminant filter 130 can be monitored by an air contamination sensor 131 that is internal to the AHU 108. For example, a level of contamination of the outside air can be compared to an internal level of contamination that is measured downstream of the filter 130. The comparison can be used to set the threshold for closing the AHU 108. The comparison can also indicate degradation in the filtering capacity of the filter 130. When the AHU 108 is operating in a closed mode, the air contamination sensor 131 can indicate contamination originating within the IT module 106 that can require remediation.

In one embodiment, a contamination source can be remote from the location of the AHU 108, and monitored by a secondary sensor, which reports (or forwards) a contaminant level reading to the contamination sensor 131. For example the facility hosting the IHS and AHU can be located downstream from a chemical processing plant that can occasionally produce emissions that are harmful to one or more components of the HIS (e.g. a corrosive emission). A remote sensor (e.g., a municipality sensor) can be located at the chemical plant or at a location that enables detection of the chemical emission heading towards the location of the IHS. The remote sensor can then transmit, either via a wired network or wirelessly, a signal indicating the present of the harmful air-borne emissions, which signal triggers the contamination sensor 131 to cause the AHU to enter into a closed mode. Other examples of such contamination sources include, but are not limited to, forest fires, tornadoes, and hurricanes, which each source having a sensor that monitors and reports the presence of harmful ambient conditions that trigger the closed mode of operation by the AHU. In yet another embodiment, a combination of conditions can be utilized in determining when to enter into a closed mode of operation. For example, a low level of contamination may not necessarily trigger the closed mode in dry conditions, while the same level of contamination, in humid conditions, can result in corrosion or other harmful conditions and thus would require the contamination sensor 131 place the AHU in the closed mode.

The AHU 108 can be configured for a mode of cooling that is appropriate for the outside ambient conditions. In one or more embodiments, the AHU 108 can be configured by the MMC system 102 for one of (1) a normal mode, (2) a mixed mode, (3) a mechanical trim mode, and (4) a closed mode.

FIG. 1A illustrates the AHU 108 having an MMC controller 134 that is responsive to air sensing components 136. Air sensing components 136 can include, but are not limited to, a humidity sensor 138, a temperature sensor 140, and a gas/liquid/solid contaminant sensor 142. When the air sensing components 136 indicate that the ambient temperature of the exterior air is within an acceptable (or normal) range ($T_N$) and that the humidity of the exterior air is also within an acceptable range ($H_N$), the MMC controller 134 configures the AHU 108 for normal mode cooling, which involves using only the outside air for cooling of the IHSes. An exhaust damper 144 is opened between the return chamber 116 and the exhaust chimney 118 to allow the exhaust air to exit the AHU 108. Simultaneously or concurrently, a recirculation damper 146 is closed between the return chamber 116 and the intake chamber 120 to prevent recirculation of the exhaust air. An outside air intake damper 148 is opened, allowing outside air from the outside environment 122 to enter the AHU 108. In normal mode, a direct expansion (DX) cooling unit 150 that supports the AHU 108 remains off.

FIGS. 1A, 1B, 2A, 2B, 3A, 3B, 4A and 4B illustrate the DX cooling unit 150 having a first compressor 154 and a second compressor 156 for stepped performance. The compressors 154, 156 compress and move compressed (liquid) coolant on a high side from a coolant tank 158 through a discharge line 160 and through a condenser coil 162. A condenser motor 164 drives a condenser fan 166 to move condensing air through the condenser coil 162. The condensing air convectively removes heat (generated during the compression) from the coolant. An expansion device (not shown) downstream of the condenser coil 162 causes expansion cooling by creating a pressure loss between the high and low sides of the DX cooling unit 150. An evaporator coil 168 transfers heat from its ambient environment to the coolant that is then pulled from a suction line 170 back to the coolant tank 158. In one embodiment, the DX cooling unit 150 is part of a chiller system 172 in order to avoid short cycling of the compressor 154. The DX cooling unit 150 chills water in an insulated storage tank 174 that receives the cooling from the evaporator coil 168. The chiller system 172 then includes a heat exchanger 176 that includes the chiller coil 132 and a heat sink coil 178 in the insulated storage tank 174. The MMC controller 134 activates a chiller pump 180 to move coolant through the chiller coil 132 and a heat sink coil 178. The compressor 154 can operate for a period of time that is efficient with the insulated storage tank 174 supplying an amount of cooling as needed by pumping a determined flow rate. Chiller capacity can be stepwise modulated, such as by turning scroll compressors on and off.

In one embodiment, when all of the compressors become engaged per chiller, then the AHU 108 can be configured for closed mode.

The DX cooling unit 150 can server as a dehumidifier 179 that removes moisture as condensate at the chiller coil 132. Thereby, outside humidity value that is above the acceptable range, or would become too high during mechanical trim mode, can be removed. In addition, in one embodiment, the MMC cooling system 102 can include a humidifier 181 that increases the level of humidity in the moderated outside air by adding moisture.

Figure 2B:
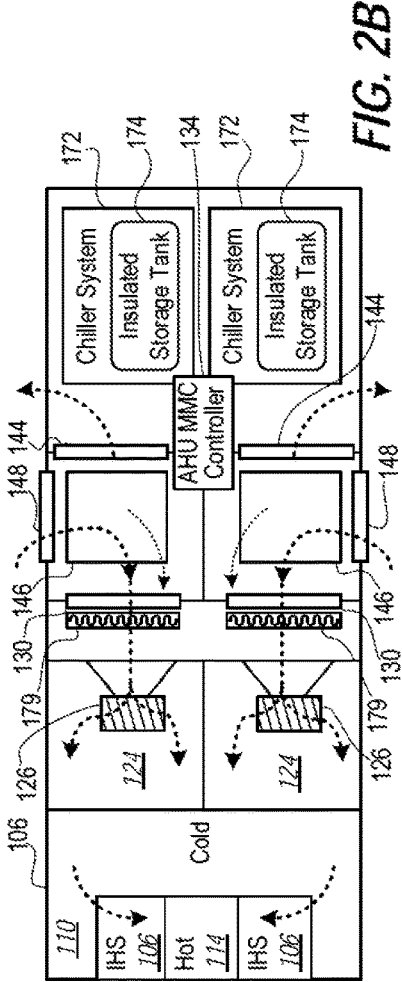
FIG. 2B illustrates a diagrammatic top view of the mixed and multi-mode cooling system of FIG. 2A that configures the AHU to cool the IT module of the data center via mixed mode cooling, according to one or more embodiments.

FIGS. 2A-2B illustrate the air sensing components 136 indicating that the level of contaminant 103 is acceptably low. The MMC controller 134 can respond by optimizing use of outside cooling air based upon temperature and humidity, which in this instance includes an outside temperature value that is lower than acceptable to fall within a mixed range. The MMC controller 134 triggers the AHU 108 for mixed mode cooling by (i) opening the exhaust damper 144, (ii) modulating the recirculation damper 146 as necessary to warm the outside air, and (iii) opening the outside air intake damper 148. In mixed mode, the DX cooling unit 150 is off. For mixed mode, the outside environment 122 is colder than acceptable for normal mode ($T_M$). Recirculating a portion of the hot exhaust air from the IT module 106 warms the outside air to an acceptable temperature. Warming the air in mixed mode reduces the dew point of the resultant cooling air within the AHU 108. Generally this reduction in relative humidity of the outside humidity value ($H_M$) results in a modified humidity value that remains within an acceptable range.

Figure 3A:
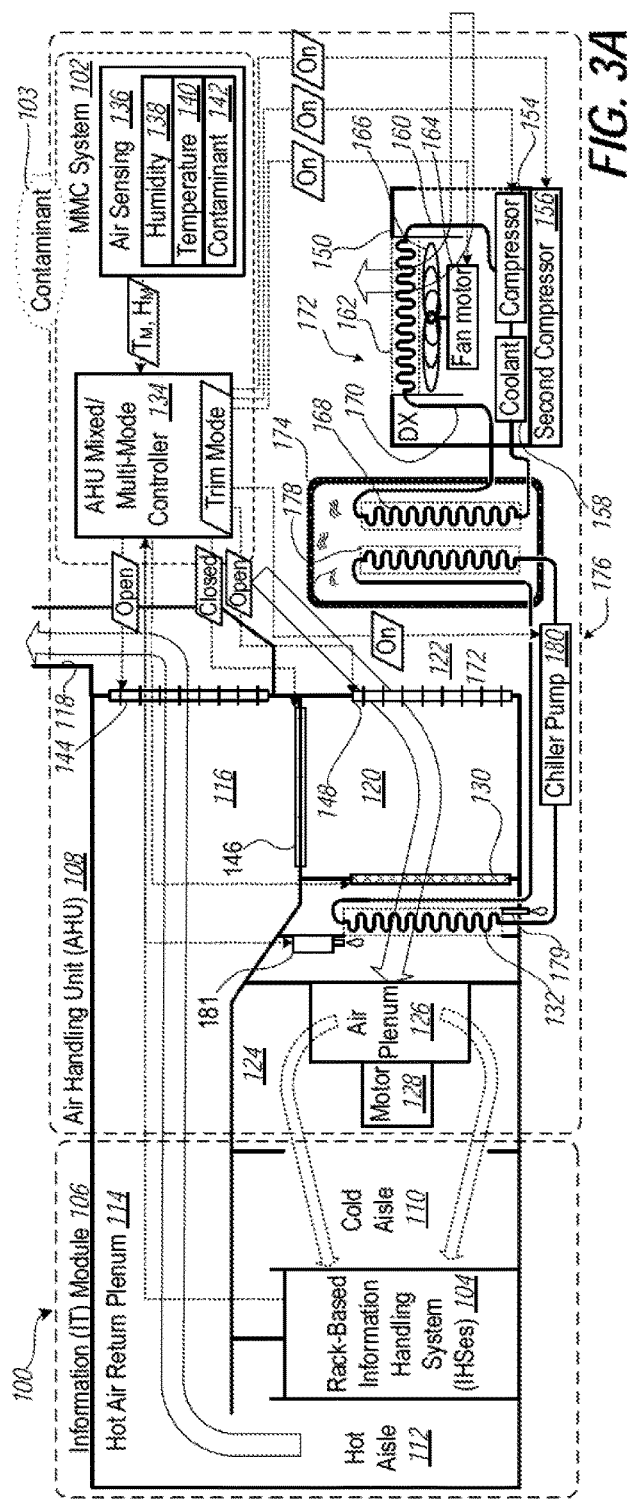
FIG. 3A illustrates a diagrammatic side view of the mixed and multi-mode cooling system of FIG. 1A that configures the AHU to cool the IT module of the data center using mechanical trimming, according to one or more embodiments.
Figure 3B:
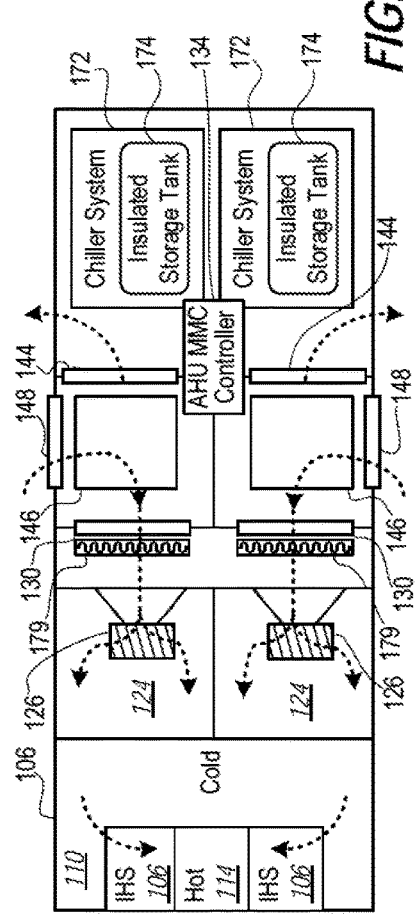
FIG. 3B illustrates a diagrammatic top view of the mixed and multi-mode cooling system of FIG. 3A that configures the AHU to cool the IT module of the data center using mechanical trimming, according to one or more embodiments.

FIGS. 3A-3B illustrate the air sensing components 136 indicating that the level of contaminant 103 is acceptably low. The MMC controller 134 can respond by optimizing use of outside cooling air based upon temperature and humidity, which in this instance is an elevated temperature range and a moderate humidity range that fall within a mechanical trim range. The MMC controller 134 triggers the AHU 108 for mechanical trim cooling mode by (i) opening the exhaust damper 144, (ii) closing the recirculation damper 146, and (iii) opening the outside air intake damper 148. For mechanical trim mode, the AHU 108 realizes power efficiencies of cooling with outside air with some additional cooling provided by the DX cooling unit 150 that is operating at a stepped down mode. In addition, the amount of recirculation within the AHU 108 can be modulated for purposes such as making the air dryer. The MMC controller 134 triggers the mechanical trim mode in response to the outside temperature value ($T_T$) and the outside humidity value ($H_T$) each being within a mechanical trim range. The outside air can be cooled to the acceptable temperature range by the DX cooling unit 150, while maintaining or bringing the humidity within the acceptable humidity range.

Figure 4A:
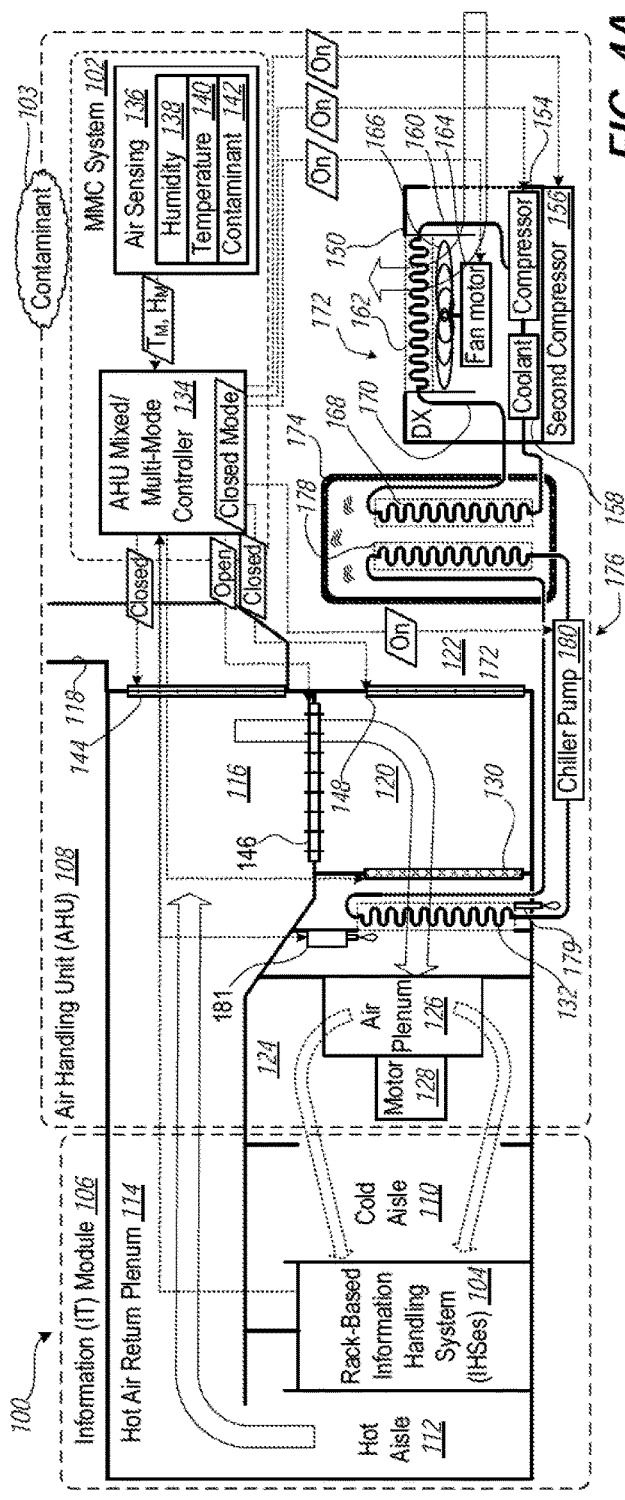
FIG. 4A illustrates a diagrammatic side view of the mixed and multi-mode cooling system of FIG. 1A that configures the AHU to cool the IT module of the data center via a closed mode cooling, according to one or more embodiments.
Figure 4B:
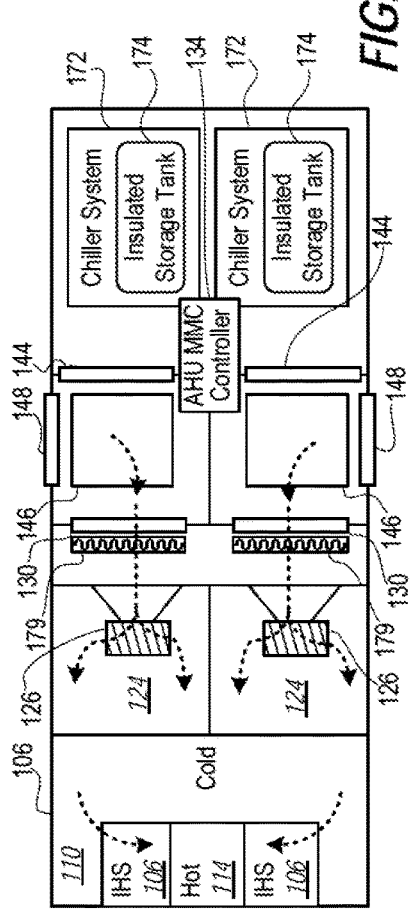
FIG. 4B illustrates a diagrammatic top view of the mixed and multi-mode cooling system of FIG. 4A that configures the AHU to cool the IT module of the data center via a closed mode cooling, according to one or more embodiments.

FIGS. 4A-4B illustrate the MMC controller 134 configuring the AHU 108 for closed mode in order to prevent an elevated level of contaminant 103 from causing damage to the data center 100. Alternatively, when the level of contaminant 103 is acceptably low, the MMC controller 134 triggers the AHU 108 for closed mode when the temperature value and outside humidity value do not fall within a range that allows for use of outside cooling air. The MMC controller 134 triggers the AHU 108 for closed mode by (i) closing the exhaust damper 144, (ii) opening the recirculation damper 146, and (iii) closing the outside air intake damper 148. In addition to when the level of contaminant 103 is not acceptably low, closed mode is used when the outside ambient conditions ($T_C$, $H_C$) are not conducive to the use of outside air for cooling. For example, the DX cooling unit 150 may not have separate stages/compressors that allow for a reduced amount of mechanical cooling suitable for mechanical trim mode. For another example, the outside temperature and/or humidity can be too high for mechanical trim to remove enough heat and/or humidity to reach an acceptable range. When the MMC system 102 is operating in the closed mode, the DX cooling unit 150 provides all of the cooling necessary to maintain the IT module 106 within an acceptable temperature and humidity range.

TABLE 1 summarizes the configurations of the AHU 108 for the exemplary four (4) modes of normal mode (FIGS. 1A-1B), mixed mode (FIGS. 2A-2B), mechanical trimmed mode (FIGS. 3A-3B), and closed mode (FIGS. 4A-4B):

TABLE 1

|  | Intake Damper | Recirculation Damper | Exhaust Damper | Chiller |
|---|---|---|---|---|
| Mode 1: Normal | Open | Closed | Open | Off |
| Mode 2: Mixed | Open | Modulated 0-100% | Conversely Mod 100-0% | Off |
| Mode 3: Trim | Open | Modulated 0-100% | Conversely Mod 100-0% | On |
| Mode 4: Closed | Closed | Open | Closed | On |

Figure 5:
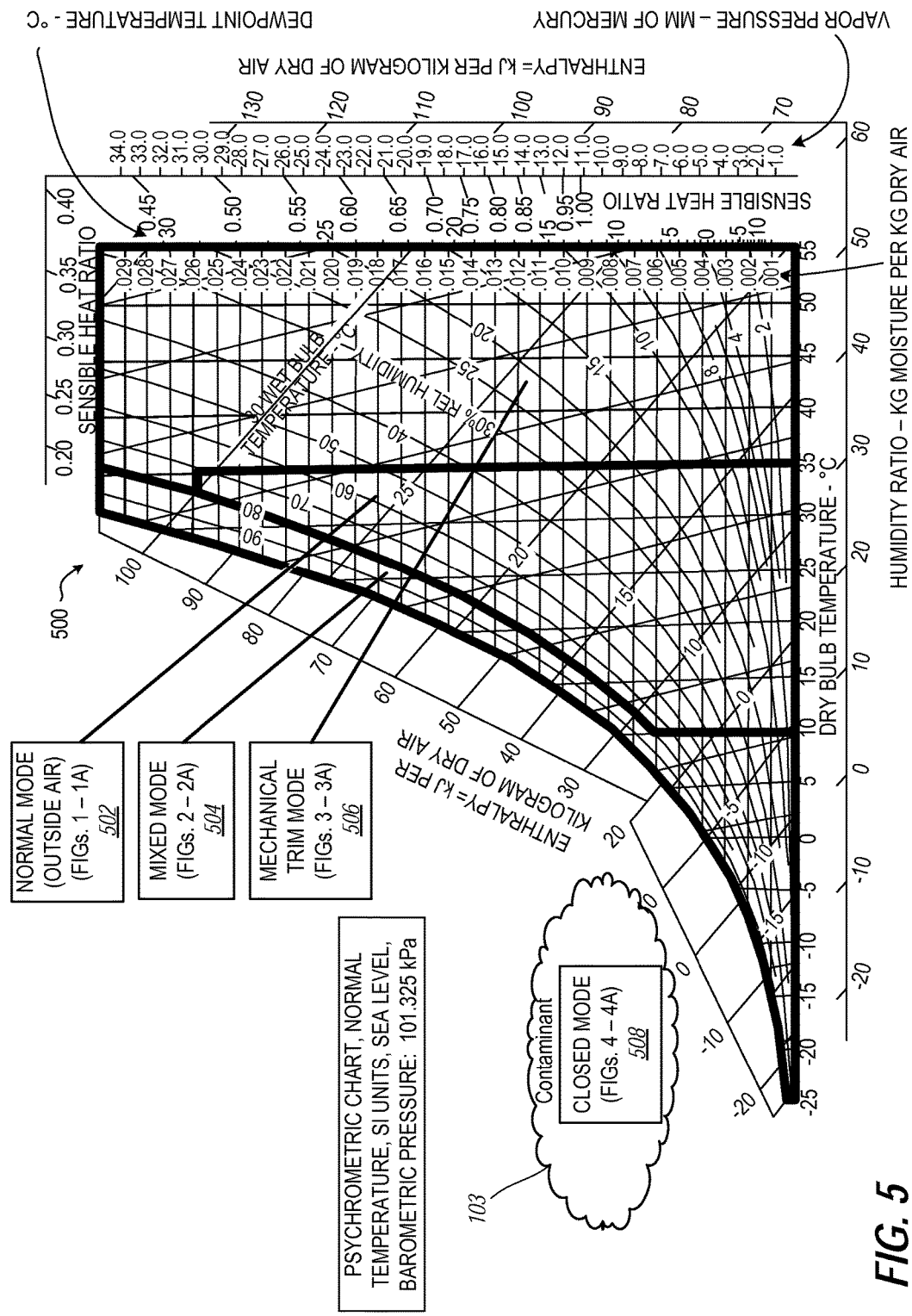
FIG. 5 illustrates a psychometric chart of an exemplary mapping of outside temperatures values and outside humidity values that trigger cooling via normal mode that uses outside air, a mixed mode, and mechanical trim mode for all ranges of temperature and humidity with mechanical cooling (or closed) mode used for contamination, according to one or more embodiments.

FIG. 5 illustrates an example psychometric chart 500 of an illustrative mapping of outside temperatures values and outside humidity values for the various cooling modes, from among a normal mode 502 that uses only outside air, a mixed mode 504, and a mechanical trim mode 506 for three ranges of ambient conditions of temperature and humidity. Mechanical cooling mode 508 is used for all three ranges in instances of outside contaminants 103.

Figure 6:
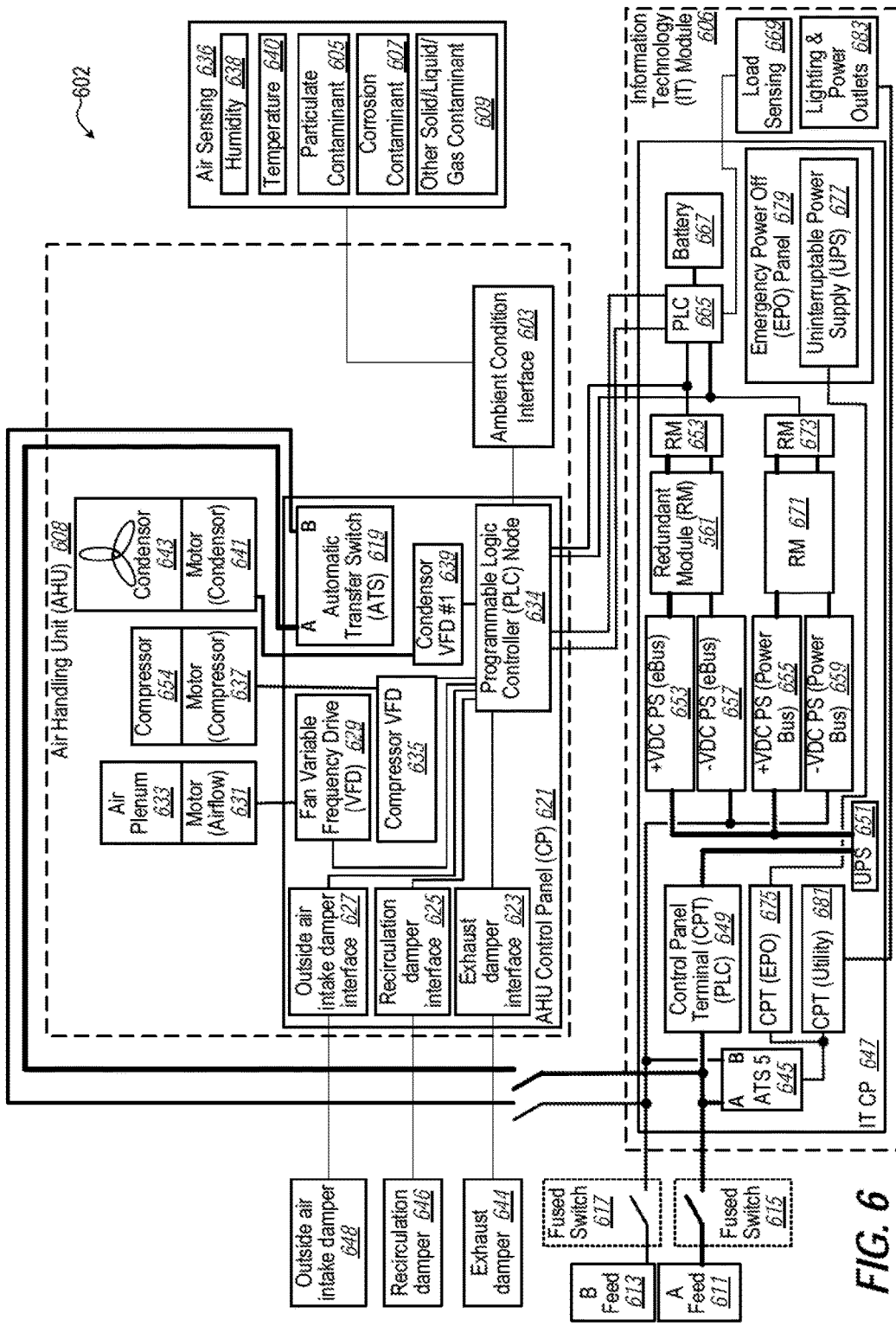
FIG. 6 illustrates an exemplary power and computing environment of the mixed and multi-mode cooling system of FIG. 1 that triggers the AHU to cool the IT module of the data center, according to one or more embodiments.

FIG. 6 illustrates an exemplary power and computing environment of an example MMC system 602 that configures an AHU 608 to efficiently cool an IT module 606 of a data center 600. A programmable logic controller (PLC) node ("controller") 634 of the MMC system 602 communicates via an ambient condition interface 603 to outside air sensing components 636 to ascertain suitability of using outside air for cooling. For example, the outside air sensing components (or air sensors) 636 can include a relative humidity sensor 638 and a temperature sensor 640. As shown, the outside air sensing components 636 can also include a particulate contaminant sensor 605, a corrosion contaminant sensor 607, and other solid/liquid/gas contaminant sensor 609. Certain outside conditions, including, but not limited to temperature and humidity, can render the outside air unsuitable for direct use, and require the MMC System 602 to implement a different mode of cooling.

Turning now to the power aspects and communication aspects of MMC system 602, "A" feed source 611 and "B" feed source 613 provide electrical power for the MMC system 602 via respective fused switches 615, 617. AHU 608 receives the "A" and "B" feeds at an automatic transfer switch (ATS) 619 in an AHU control panel (CP) 621. ATS 619 in turn provides power to the controller 634 that activates other components in AHU 608. For example, the controller 634 can communicate with an exhaust damper interface 623 to activate an exhaust damper 644. The controller 634 can communicate with a recirculation damper interface 625 to activate a recirculation damper 646. The controller 634 can communicate with an outside air intake damper interface 627 to activate a recirculation damper 648. The controller 634 can communicate with a fan variable frequency drive (VFD) 629 that activates an air flow motor 631 of an air plenum 633. The controller 634 can communicate with a compressor VFD 635 that activates a compressor motor 637 of an air plenum 633. And, The controller 634 can communicate with a condenser VFD 639 that activates a condenser motor 641 that turns a condenser fan 643.

IT module 606 also receives the "A" and "B" feeds at an ATS 645 in an IT CP 647. The "A" feed also passes through a PLC control panel terminal (CPT) 649 to an uninterruptable power supply (UPS) 651 that in turn passes "A" feed to eBus +VDC power supply (PS) 653 and to power bus +VDC PS 655. "B" feed is passed to eBus −VDC PS 657 and to power bus −VDC PS 659. The eBus +VDC PS 653 and eBUS −VDC PS 657 provide electrical power through two series redundant modules (RM) 661, 663 to an IT PLC 665 having a battery backup 667 as well as to the controller 634 in the AHU 608 that monitors eBus status. The IT PLC 665 also communicates with controller 634 to indicate data from load sensing components 669. Power bus +VDC PS 655 and eBUS −VDC PS 659 provide electrical power through two series RMs 671, 673 to the IT PLC 665 and to the controller 634. An output of the IT ATS 645 passes through an emergency power off (EPO) CPT 675 to a UPS 677 of an EPO panel 679. The output of the IT ATS 645 also passes through a utility CPT 681 to lighting and power outlets 683.

Increasing the use of outside air was shown by deterministic analysis to provide substantial power savings for several illustrative locations as detailed in the following table. TABLE 1 provides outside conditions for Santiago, Chile (10 year average values for each mode are used in power usage efficiency (PUE) calculation):

TABLE 1

| | % of Hours per Range | | | | | | | | | |
|---|---|---|---|---|---|---|---|---|---|---|
| | 2003 | 2004 | 2005 | 2006 | 2007 | 2008 | 2009 | 2010 | 2011 | 2012 |
| Mechanical Cooling (MC) | 2.2% | 1.5% | 2.2% | 1.8% | 1.4% | 2.1% | 3.2% | 2.4% | 2.8% | 3.1% |
| Outside Air (Free Air) | 9.0% | 9.4% | 7.6% | 8.6% | 7.2% | 10.0% | 8.8% | 8.2% | 8.0% | 9.0% |
| Hot Air Mixing (Free Air) | 88.8% | 89.4% | 90.2% | 89.7% | 91.3% | 88.1% | 88.0% | 89.4% | 89.2% | 88.2% |
| Humidification needed | 10.5% | 6.9% | 4.5% | 4.2% | 17.3% | 5.4% | 10.1% | 11.8% | 15.2% | 10.7% |

Figure 7:
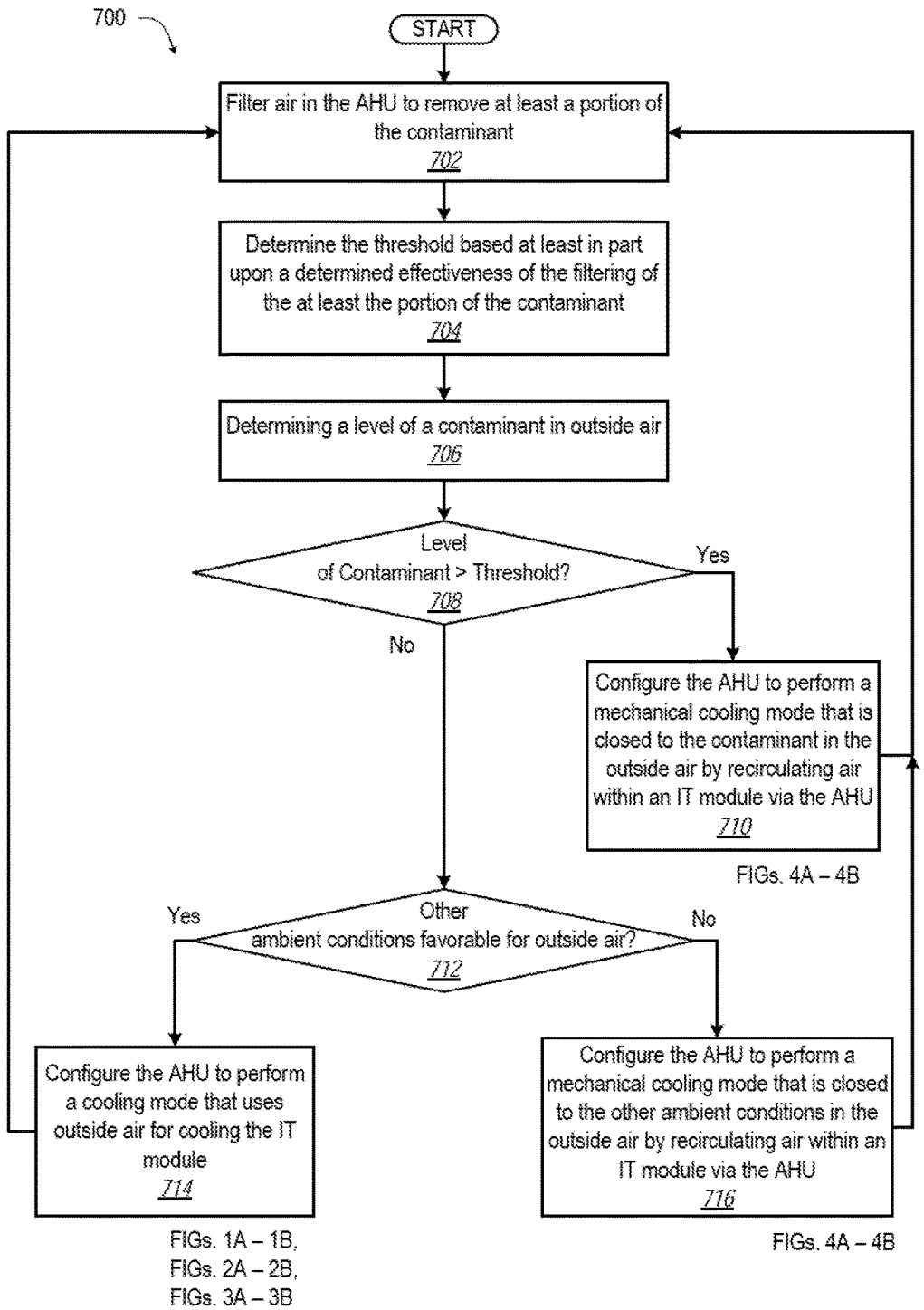
FIG. 7 illustrates a flow diagram of a method for circulating outside air through air IT modules within a large scale IHS having an AHU when permitted by an acceptable level of contaminants in the outside air; according to one or more embodiments.

FIG. 7 illustrates a method 700 for cooling IT modules within a large scale IHS having an AHU. In one embodiment, the method 700 includes filtering air in the AHU to remove at least a portion of the contaminant (block 702). The contaminant can be gaseous, liquid or solid particles. The contaminant can also be corrosive. It is appreciated that the contaminant is dependent on the location of the data center, and that the specific locations may have more than one contaminant that require monitoring. That is, in one or more embodiments, the contaminant can comprise more than one material. The method 700 includes determining the threshold based at least in part on a determined effectiveness of the filtering of the portion of the contaminant (block 704). The method 700 further includes determining a level of a contaminant in outside air (block 706). For environments having more than one contaminant, each contaminant can have a different threshold. The method 700 includes determining whether the level of the specific contaminant exceeds the corresponding threshold established for that contaminant (decision block 708). In response to determining that the level of the contaminant exceeds the threshold in decision block 708, the method 700 includes configuring the AHU to perform cooling using a mechanical cooling mode that closes the cooling system off from the outside air (to prevent or substantially reduce the exposure of the IT gear to the contaminant) and performs cooling by recirculating air within an IT module via the AHU (block 710). In response to determining that the level of the contaminant does not exceed the threshold in decision block 708, the method 700 further determines whether other ambient conditions are favorable for using outside air to cool the IT module (decision block 712). In response to determining in decision block 712 that the other ambient conditions are favorable for using outside air, the method 700 includes configuring the AHU to use outside air for cooling the IT module (block 714). In response to determining in decision block 712 that the other ambient conditions are favorable for using outside air, the method 700 includes configuring the AHU to use outside air for mechanical cooling nide that is closed to the other ambient conditions of the outside air by recirculating air within the IT module (block 716). After either of blocks 710, 714, and 716, the method 700 returns to block 702 to dynamically monitor and to respond to ambient conditions.

Figure 8A:
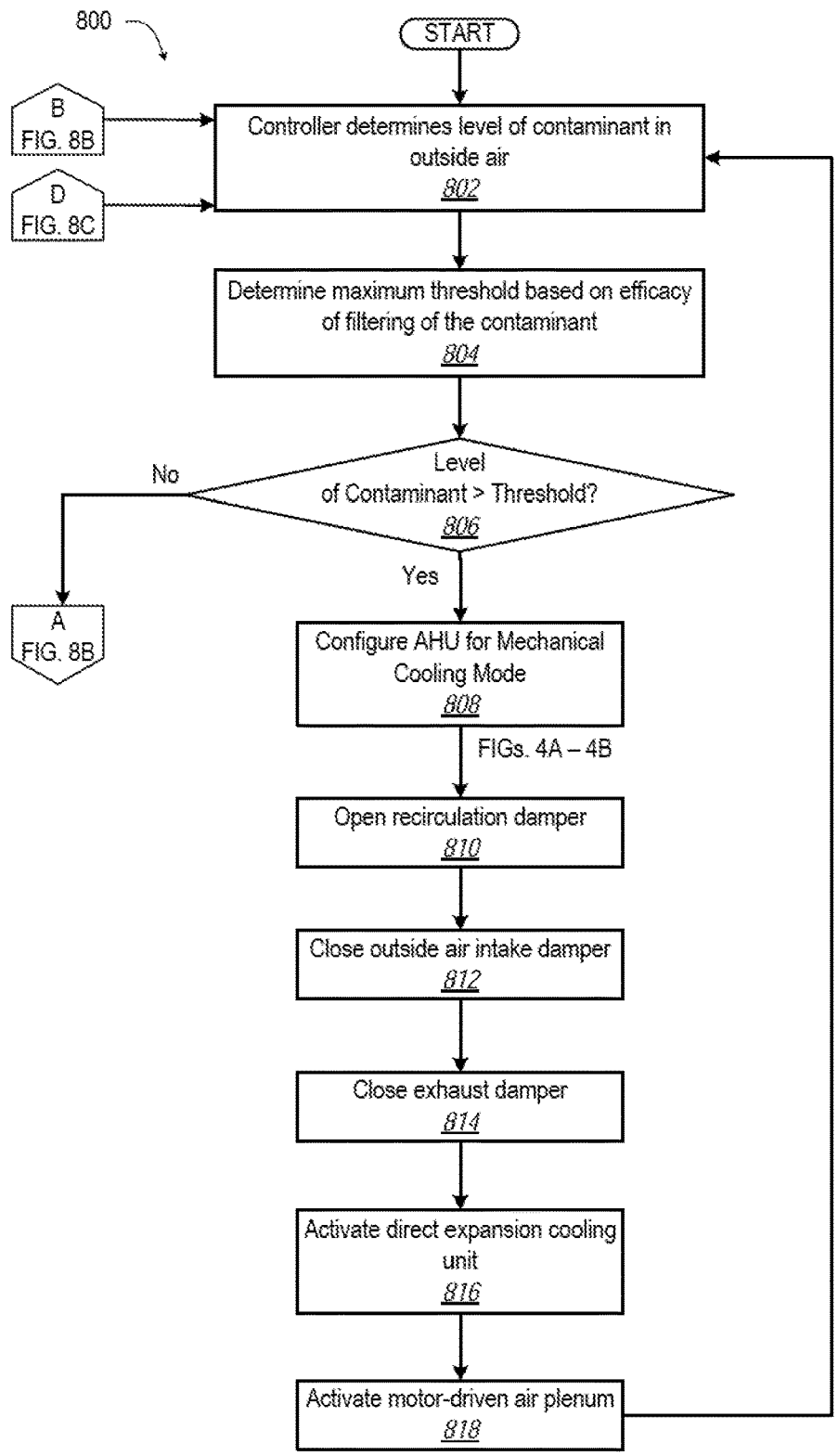
FIGS. 8A-8C illustrate a flow diagram of an exemplary method of cooling a data center that utilizes outside air for greater economy in an expanded range of temperatures and humidity when permitted by an acceptable level of contaminants in the outside air, according to one or more embodiments.
Figure 8B:
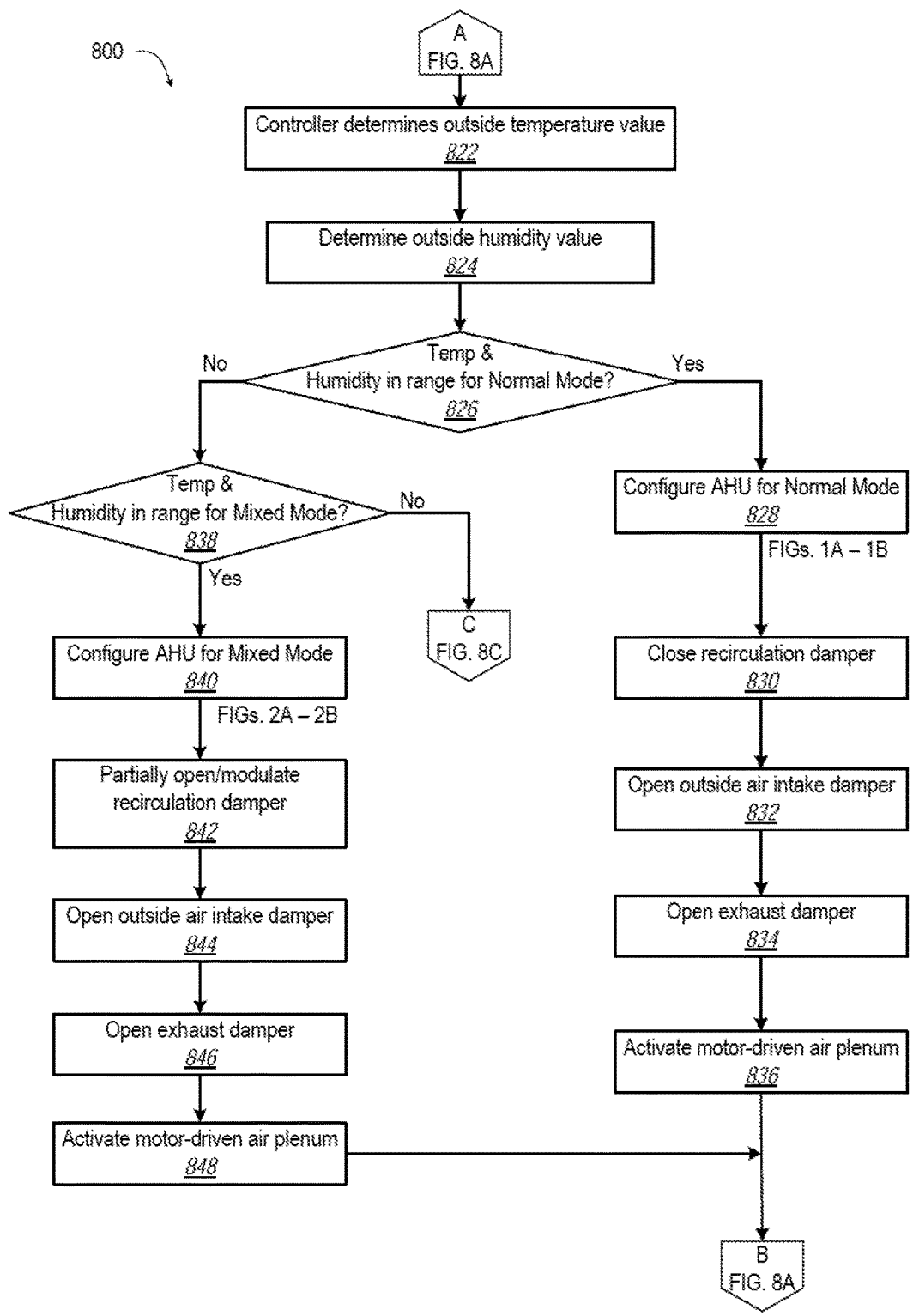
Figure 8C:
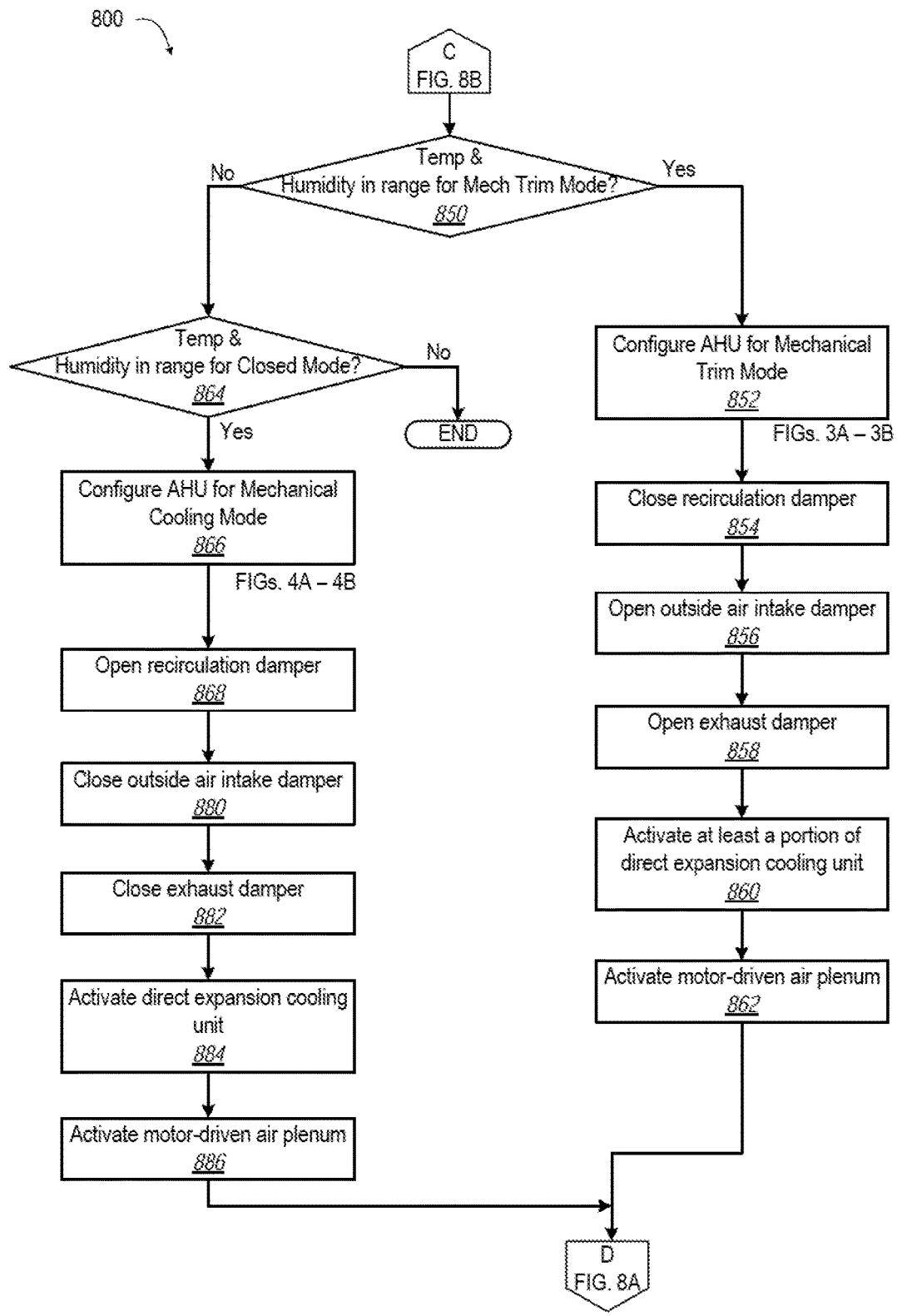

FIGS. 8A-8C illustrate an exemplary method 800 of cooling a data center, and more particularly an Expandable Modular Rack-Housing Building Infrastructure (EMRBI), that is responsive to environmental conditions to prevent contaminants from causing damage to the IT modules within the data center. To the extent permissible by a level of contaminant in outside air, the method 800 provides for cooling the data center with outside air for greater economy in an expanded range of temperatures and humidity, according to one embodiment. With initial reference to FIG. 8A, the method 800 begins at start block. The controller determines a level of contaminant in outside air (block 802). The contaminant can be a substance, compound, material, etc., that has a negative effect on or more IT components with the IHS. The negative effect can include corrosion. The contaminant can be gaseous, liquid or a solid particulate matter. In one embodiment, the controller measures a level respectively of more than one contaminant, each associated with a different threshold for rendering cooling air acceptable for use in the data center. In one embodiment, the AHU includes one or more filters that filter a portion of the one or more types of contaminants from the outside air that is pulled into the AHU for cooling air. Controller can determine a maximum threshold of contaminant in the outside air based upon the efficacy of filtering of the contaminant. The efficacy can be determined based on a preset value, a deterministic changing value based upon monitoring usage of filtering material, or can be dynamically sensed downstream of the filter (block 804).

The controller determines whether the level of the contaminant in the outside air exceeds the threshold (block 806). In response to determining in decision block 806 that the level of contaminant exceeds the threshold, method 800 can further include the controller determining that mechanical cooling mode is warranted (decision block 808). In particular, the method 800 includes the controller fully opening the recirculation damper between the hot air return plenum and the intake air chamber (block 810). The controller closes the outside air intake damper at the outside air intake to the intake air chamber (block 812). The controller closes the exhaust damper between the hot air return plenum and an exhaust chimney (block 814). The controller activates the direct expansion cooling unit that has the expansion unit within the intake air chamber. In one embodiment, the controller activates less than all of the compressors available of a direct expansion cooling unit that cool a chiller system (block 816). The controller activates the motor-driven air plenum to draw air from the hot air plenum into the intake air chamber to the cold aisle of the IT module, and the air then passes through the rack-mounted IHSes to the hot aisle of the IT module and ultimately to the hot air return plenum for full recirculation (block 818). The method 800 then returns to block 802 to dynamically monitor outside conditions in order to select an appropriate cooling mode. In response to determining in decision block 806 that the level of contaminant in outside air does not exceed the threshold, method 800 proceeds to block 822 (FIG. 8B).

Continuing in FIG. 8B, the method 800 includes the controller determining an outside temperature value (block 822). The controller determines an outside humidity value (block 824). The controller can then determine whether the outside temperature value is within an acceptable temperature range and whether and the outside humidity value is within an acceptable humidity range for normal mode (decision block 826). In response to determining that both that the outside temperature value is within the acceptable temperature range and that the outside humidity value is within the acceptable humidity range, the controller triggers an AHU to perform the normal mode of outside air cooling of an IT module containing rack-mounted IHSes (block 828). In particular, the controller closes a recirculation damper between a hot air return plenum and an intake air chamber (block 830). The controller opens an outside air intake damper at an outside air intake to the intake air chamber (block 832). The controller opens an exhaust damper between the hot air return plenum and an exhaust chimney (block 834). The controller activates a motor-driven air plenum to draw air through the IT module. In particular, the air is drawn from the intake air chamber to a cold aisle of the IT module that in turn passes air through the rack-mounted IHSes to a hot aisle of the IT module and ultimately to the hot air return plenum for exhausting out of the exhaust chimney (block 836). The method 800 returns to block 802 (FIG. 8A) to dynamically monitor outside conditions in order to select an appropriate mode.

In response to determining in decision block 826 that one of the outside temperature value and the outside humidity value is not in a range for normal mode cooling, the controller makes a further determination as to whether the outside temperature value is below the acceptable temperature range, while the outside humidity value is within the acceptable humidity range for cooling via mixed mode (decision block 838). In response to the determination in decision block 918 that at least one (or the combination of) the outside temperature value and outside humidity value are in the range pre-identified to trigger mixed mode cooling, controller triggers the AHU to cool the IT module by implementing the mixed mode cooling (block 840). In particular, the controller partially opens the recirculation damper between the hot air return plenum and the air intake chamber (block 842). In one embodiment, the amount that the recirculation damper is opened is modulated in relation to the amount of heating of the outside air required to maintain an acceptable temperature range within the IT module. In one embodiment, a thermostat is utilized to track the temperature of the air inside the AHU. The thermostat is communicatively connected to the controller to provide real time temperature readings of the cooling air and moderated air. The controller opens the outside air intake damper at the outside air intake to the air intake chamber (block 844). The controller opens the exhaust damper between the hot air return plenum and the exhaust chimney (block 846). The controller activates the motor-driven air plenum blower to draw air through the IT module. In particular, the air is drawn from the air intake chamber to the cold aisle of the IT module and the air in turn passes through the rack-mounted IHSes to the hot aisle of the IT module and ultimately to the hot air return plenum for partially exhausting out of the exhaust portal and partially recirculating (block 848). The method 800 then returns to block 802 (FIG. 8A) to dynamically monitor outside conditions in order to select an appropriate mode.

In response to determining in decision block 838 that at least one (or both of) the outside temperature value and the outside humidity value are not in a range for mixed mode cooling, method moves to FIG. 8B, which includes the controller determining whether at least one of the outside temperature value and the outside humidity value is within a range for mechanical trim mode cooling (decision block 850). Mechanical trim mode relies on mechanical cooling in combination with outside air cooling. When in mechanical trim mode, The outside temperature value and outside humidity value are within a certain range that allows for a stepped down performance level of a direct expansion cooling unit in combination with outside air to be satisfactory. The outside humidity value is below a maximum humidity threshold such that cooling of the outside air will not result in moderated air that has a humidity level above what is acceptable for the IT module. In response to the determination in decision block 850 that the outside temperature value and the outside humidity value are within a range for implementing the mechanical trim mode, the controller triggers the AHU for mechanical trim mode cooling and cools outside air with mechanically cooling (block 852). In particular, the method 800 includes the controller closing the recirculation damper between the hot air return plenum and the air intake chamber (block 854). The controller opens the outside air intake damper at the outside air intake to the air intake chamber (block 856). The controller opens the exhaust damper between the hot air return plenum and an exhaust portal (block 858). The controller activates at least a portion of the direct expansion cooling unit that has an expansion unit with the air intake chamber. (block 860). The controller activates the motor-driven air plenum blower to draw air from the air intake chamber to the cold aisle of the IT module that in turn passes air through the rack-mounted IHSes to a hot aisle of the IT module and ultimately to the hot air return plenum for exhausting out of the exhaust portal (block 862). The method 800 then returns to block 802 (FIG. 8A) to continue dynamically monitoring outside air conditions in order to select an appropriate cooling mode.

In response to determining in decision block 850 that the outside temperature value and the outside humidity value are not in a range for mechanical trim mode, FIG. 8C illustrates that the method 800 can further include the controller determining whether the outside temperature value and the outside humidity value are within a range for mechanical cooling mode (decision block 864). In particular, the method 800 includes the controller fully opening the recirculation damper between the hot air return plenum and the air intake chamber (block 866). The controller closes the outside air intake damper at the outside air intake to the air intake chamber (block 868). The controller closes the exhaust damper between the hot air return plenum and an exhaust chimney (block 880). The controller activates the direct expansion cooling unit to cool the air drawn into the air intake chamber. In one embodiment, the controller activates less than all of the compressors available of a direct expansion cooling unit that cool a chiller system (block 882). The controller activates the motor-driven air plenum blower to draw air from the hot air plenum into the air intake chamber. The motor-driven air plenum blower pushes the moderated air into the cold aisle of the IT module. The air then passes air through the rack-mounted IHSes to the hot aisle of the IT module. The warmed air then returns to the hot air return plenum for full recirculation (block 884). The method 800 then returns to block 802 (FIG. 8A) to dynamically monitor outside conditions in order to select an appropriate mode. In response to determining in decision block 842 that the outside temperature value and the outside humidity value are not in a range for mechanical cooling mode, FIG. 8C illustrates that the method 800 ends. In one embodiment, the controller can perform error handling for encountering a temperature range for which there is not a defined cooling configuration of the AHU. It is important to note that none of the cooling modes that involve use of outside air are made available to the cooling system once the level of contaminants within the outside air reaches or surpasses the corresponding threshold for that contaminant.

Embodiments according to the present disclosure can have more or less cooling modes than the four illustrative cooling modes of normal, mixed, mechanical trim and mechanical cooling. For example, a geographic location can have a climate pattern that makes one of the modes unnecessary or requires an additional mode.

The cooling system can be part of an Expandable Modular Information Technology (IT) Building Infrastructure (EMITBI) that supports a large-scale modularly-constructed information handling system (LMIHS). In one embodiment, a large compute pad/building structure has interior white space for racks and exterior walls that are designed to enable modular expansion of the structure by extending the build pad, constructing a second external wall, installing the additional IT gear in the extended white space, and then removing the previous exterior wall to create larger overall computer system without disrupting the IT gear, which remains operational during the expansion process; A scaled approach is provided to add devices and redundancy while physically expanding a data center (footprint) using prefabricated IT modules for cooling, power, and white space for future IT placement. An external wall can be added to a cold aisle module. Materials for modular walls can be lightweight composite fiber, metal panel with fiberglass insulation, structural foam panel, etc., with sound proofing considerations. The modular walls can provide mounting surfaces for sensors, etc. In one embodiment, the EMITBI includes dedicated hot and cold IT modules that are expandable. AHUs can sit on top of the structure for limited ground space applications or on one or two sides of the white space. AHUs can be added as needed when expansion occurs.

The cooling system can be part of configurable modular data center. Each of the modules may be dedicated to one of the primary elements of a data center, such as fluid handling, computing and power. Each of the plurality of modules may be separately configurable, according, at least in part, to operational and environmental requirements for the modular data center. The plurality of modules may then be incorporated into at least one modular data center structure, whose size and shape will depend, at least in part, on the configuration of each of the plurality of modules. One advantage is in escaping the design constraints of an existing containerized data center integrated into an International Organization for Standardization (ISO) shipping container. Breaking design elements into separately configurable modules generally removes the space limitations of an existing containerized data center.

In the above described flow charts of FIGS. 7 and 8A-8C, one or more of the methods may be embodied in an automated controller of a cooling system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A cooling system that circulates cooling aft through information technology (IT) modules within a large scale information handling system (IHS), the cooling system comprising:
   an air handling unit (AHU) to direct cooling air through an IT module;
   an ambient condition interface in communication with at least one outside contamination sensor to determine a level of a contaminant in outside air;
   a controller in communication with the ambient condition interface and the AHU and which causes the cooling system to selectively operate in one of four modes from among a normal mode, a mixed mode, a mechanical trimmed mode, and a closed mode, wherein an intake damper is open in each of the normal mode, mixed mode, and trim mode, and is closed in the closed mode and a recirculation damper is open in the closed mode, closed in the open mode, and modulated between open and closed in each of the mixed mode and trim mode, the controller causing the cooling system to:
   determine a level of a contaminant in the outside air;
   determine whether the level of the contaminant exceeds a threshold;
   and in response to determining that the level of the contaminant exceeds the threshold, place the cooling system in the closed mode and trigger the AHU to perform cooling via a mechanical cooling mode that includes closing an intake for outside air into the AHU, recirculating air within an IT module via the AHU, closing an exhaust damper, and turning on a chiller;
   and in response to the level of contaminants not exceeding the threshold and other detected ambient conditions being favorable to using outside air to cool the IHS, configure the AHU to perform cooling using the outside air in one of the normal mode, mixed mode, and trim mode based on ambient/outside air conditions of temperature and humidity.

2. The cooling system of claim 1, wherein:
   the AHU further comprises a contaminant filter to filter air in the AHU to remove at least a portion of the contaminant; and the controller further determines the threshold based at least in part upon a determined effectiveness of the filtering by the contaminant filter.

3. The cooling system of claim 2, further comprising an air contamination sensor to measure an internal level of contamination within the AHU that is not removed by the contaminant filter.

4. The cooling system of claim 1, wherein the contaminant causes a negative effect on one or more of the IT components within the IHS, the negative effect being one of a group comprising corrosion.

5. The cooling system of claim 1, wherein:
the contaminant is one or more of a gas, a liquid and a solid contaminant; and
the controller further determines the level of the contaminant by performing a corresponding one or more of:
determining a first level of a solid contaminant;
determining a second level of a liquid contaminant; and
determining a third level of a gaseous contaminant.

6. The cooling system of claim 5, wherein:
the controller further determines whether the level of the contaminant exceeds the threshold by performing at least one of:
determining whether the first level of the solid contaminant exceeds a first threshold;
determining whether the second level of the liquid contaminant exceeds a second threshold; and
determining whether the third level of the gaseous contaminant exceeds a third threshold.

7. The cooling system of claim 1, wherein:
the ambient condition interface is further in communication with an outside temperature sensor and an outside humidity sensor that respectively detect an ambient condition outside of the IHS comprising at least one of an outside temperature value and an outside humidity value;
the controller is in communication with the ambient condition interface and the AHU to cause the cooling system to:
detect the outside ambient condition that includes both the outside temperature value and the outside humidity value;
determine whether the outside ambient condition is within a first range of condition values that include a first range of temperature values and a first range of humidity values that requires normal cooling mode;
in response to determining that the outside ambient condition falls within the first range of condition values and that level of the contaminant does not exceed the threshold, configure the AHU to circulate cooling air through the IHS by:
intaking outside air; and
circulating the outside air through the IHS operating space;
determine whether the outside ambient condition is within a second range of condition values that include a second range of temperature values and a second range of humidity values that requires hybrid cooling mode;
in response to determining that the outside ambient condition falls within the second range of condition values and that level of the contaminant does not exceed the threshold, configure the AHU to circulate cooling air through the IHS by:
intaking outside air;
performing a hybrid cooling mode mixing of the outside air with recirculated air to moderate the outside air and bring a condition value of the moderated outside air into the first range of condition values; and
circulating the moderated outside air through the IHS operating space; and
when the ambient condition includes only one of the outside temperature and the outside humidity being outside of a respective second range of values, the hybrid cooling mode accounts for only the one condition that falls outside of the respective second range of values.

8. The cooling system of claim 7, further comprising:
a humidifier that controllably increases humidity of air within the AHU;
a de-humidifier that controllably reduces humidity from within the air in the AHU;
wherein the controller further triggers the AHU to implement the hybrid cooling mode to moderate the outside air by:
triggering the AHU to change the outside temperature value of the outside air to a moderated temperature value that is in the first temperature range;
determining a moderated humidity value of the moderated outside air that results from changing the outside air to the moderated temperature value;
in response to the moderated humidity value being greater than the normal operating space, activating the de-humidifier to dehumidify the moderated outside air; and
in response to the moderated humidity value being less than the first range of humidity values activating the humidifier to humidify the moderated outside air.

9. The cooling system of claim 1, wherein the AHU further comprises:
a direct expansion cooling unit to cool air in the AHU;
a hot air return plenum in fluid communication with a hot aisle of the IT module and having an exhaust portal;
an air intake chamber in fluid communication with the hot air return plenum and having an air intake and air outlet;
an outlet chamber in fluid communication with the air intake chamber via the air outlet and with a cold aisle of the IT module;
a recirculation damper between the hot air return plenum and the air intake chamber;
an outside air intake damper between the outside air intake and the air intake chamber;
an exhaust damper between the hot air return plenum and the exhaust portal; and
an air mover positioned to move air from the outlet chamber to the cold aisle of the IT module; and
wherein the controller further triggers the AHU to close the intake for outside air into the AHU and recirculating air within the IT module via the AHU by opening the recirculation damper, closing the exhaust damper, closing the outside air intake damper, activating the air mover, and activating the direct expansion cooling unit.

10. The cooling system of claim 9, wherein the controller is further to:
determine whether the outside ambient condition is within a third range of condition values that include a third range of temperature values and a third range of humidity values that require mechanical trim cooling mode; and in response to determining that the outside ambient condition falls within the third range of condition values and that level of the contaminant does not exceed the threshold, the controller configures the AHU to perform the mechanical trim mode to moderate one of an outside temperature value and an outside humidity value by step-wise activating the direct expansion cooling unit to mechanically trim the outside air.

11. A method for circulating cooling air through information technology (IT) modules within a large scale information handling system (IHS) having a cooling system comprising an air handling unit (AHU), an ambient condition interface in communication with at least one outside contamination sensor to determine a level of a contaminant in outside air, a controller in communication with the ambient condition interface and the AHU and which causes selective operation in one of four modes from among a normal mode, a mixed mode, a mechanical trimmed mode, and a closed mode, wherein an intake damper is open in each of the normal mode, mixed mode, and trim mode, and is closed in the closed mode and a recirculation damper is open in the closed mode, closed in the open mode, and modulated between open and closed in each of the mixed mode and trim mode, the method comprising:
    determining a level of a contaminant in outside air;
    determining whether the level of the contaminant exceeds a threshold;
    in response to determining that the level of the contaminant exceeds the threshold, configuring the cooling system to be placed in the closed mode and triggering the AHU to perform cooling via a mechanical cooling mode that includes closing an intake damper for bringing outside air into the AHU,
    opening a recirculation damper for recirculating air within an IT module via the AHU,
    closing an exhaust damper,
    and turning on a chiller;
    and in response to the level of contaminants not exceeding the threshold and other detected ambient conditions are favorable to using outside air to cool the IHS, configuring the AHU to perform cooling in one of the normal mode, mixed mode and trim mode based on ambient/outside air conditions of temperature and humidity, each mode including opening the intake damper and using at least a portion of the outside air.

12. The method of claim 11, further comprising:
    filtering air in the AHU to remove at least a portion of the contaminant; and
    determining the threshold based at least in part upon a determined effectiveness of the filtering of the at least the portion of the contaminant.

13. The method of claim 12, further comprising determining effectiveness of the filtering by measuring an internal level of contamination within the AHU that is not removed by the contaminant filter.

14. The method of claim 11, wherein the contaminant causes a negative effect on one or more of the IT components within the IHS, the negative effect being one of a group comprising corrosion.

15. The method of claim 11, wherein:
    the contaminant is one or more of a gas, a liquid and a solid contaminant; and
    determining the level of the contaminant further comprises at least one of:
        determining a first level of a solid contaminant;
        determining a second level of a liquid contaminant; and
        determining a third level of a gaseous contaminant.

16. The method of claim 15, wherein:
    determining whether the level of the contaminant exceeds the threshold further comprises performing at least one of:
        determining whether the first level of the solid contaminant exceeds a first threshold;
        determining whether the second level of the liquid contaminant exceeds a second threshold; and
        determining whether the third level of the gaseous contaminant exceeds a third threshold.

17. The method of claim 11, wherein:
    detecting the outside ambient condition that includes both the outside temperature value and the outside humidity value;
    determining whether the outside ambient condition is within a first range of condition values that include a first range of temperature values and a first range of humidity values that requires normal cooling mode;
    in response to determining that the outside ambient condition falls within the first range of condition values and that level of the contaminant does not exceed the threshold, circulating cooling air through the IHS by:
        intaking outside air; and
        circulating the outside air through the IHS operating space;
    determining whether the outside ambient condition is within a second range of condition values that include a second range of temperature values and a second range of humidity values that requires hybrid cooling mode;
    in response to determining that the outside ambient condition falls within the second range of condition values and that level of the contaminant does not exceed the threshold, circulating cooling air through the IHS by:
        intaking outside air;
        performing a hybrid cooling mode mixing of the outside air with recirculated air to moderate the outside air and bring a condition value of the moderated outside air into the first range of condition values; and
        circulating the moderated outside air through the IHS operating space; and
    when the ambient condition includes only one of the outside temperature and the outside humidity being outside of a respective second range of values, the hybrid cooling mode accounts for only the one condition that falls outside of its respective first range of values.

18. The method of claim 17, wherein:
    implementing the hybrid cooling mode to moderate the outside air further comprises:
        triggering the AHU to change the outside temperature value of the outside air to a moderated temperature value that is in the first temperature range;
        determining a moderated humidity value of the moderated outside air that results from changing the outside air to the moderated temperature value;
        in response to the moderated humidity value being greater than the normal operating space, dehumidifying the moderated outside air; and
        in response to the moderated humidity value being less than the first range of humidity values, humidifying the moderated outside air.

19. The method of claim 11, wherein the AHU further comprises:
    a direct expansion cooling unit to cool air in the AHU;

a hot air return plenum in fluid communication with a hot aisle of the IT module and having an exhaust portal;
an air intake chamber in fluid communication with the hot air return plenum and having an air intake and air outlet;
an outlet chamber in fluid communication with the air intake chamber via the air outlet and with a cold aisle of the IT module;
a recirculation damper between the hot air return plenum and the air intake chamber;
an outside air intake damper between the outside air intake and the air intake chamber;
an exhaust damper between the hot air return plenum and the exhaust portal; and
an air mover positioned to move air from the outlet chamber to the cold aisle of the IT module; and
wherein perform cooling via the mechanical cooling mode further comprises opening the recirculation damper, closing the exhaust damper, closing the outside air intake damper, activating the air mover, and activating the direct expansion cooling unit.

20. The method of claim 19, further comprising:
determining whether the outside ambient condition is within a third range of condition values that include a third range of temperature values and a third range of humidity values that requires mechanical trim cooling mode; and
in response to determining that the outside ambient condition falls within the third range of condition values and that level of the contaminant does not exceed the threshold, performing the mechanical trim mode to moderate one of an outside temperature value and an outside humidity value by step-wise activating the direct expansion cooling unit to mechanically trim the outside air.

* * * * *